(12) United States Patent
Berman

(10) Patent No.: US 7,751,609 B1
(45) Date of Patent: Jul. 6, 2010

(54) DETERMINATION OF FILM THICKNESS DURING CHEMICAL MECHANICAL POLISHING

(75) Inventor: Michael J. Berman, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 1392 days.

(21) Appl. No.: 09/553,140

(22) Filed: Apr. 20, 2000

(51) Int. Cl.
*G06K 9/00* (2006.01)
(52) U.S. Cl. .................. 382/141; 348/86; 348/125
(58) Field of Classification Search .......... 382/141, 382/143–152; 348/86, 87, 125, 126; 356/381, 356/382, 383, 357, 632, 394, 630; 156/345; 216/85; 134/18; 438/7
See application file for complete search history.

(56) References Cited

U.S. PATENT DOCUMENTS

| | | | |
|---|---|---|---|
| 2,408,764 A | 10/1946 | Edgerton |
| 3,734,620 A | 5/1973 | Cade |
| 3,748,014 A | 7/1973 | Beiser |
| 4,312,732 A | 1/1982 | Degenkolb et al. |
| 4,374,915 A | 2/1983 | Ahlquist et al. |
| 4,632,724 A | 12/1986 | Chesebro et al. |
| 4,689,491 A | 8/1987 | Lindow et al. |
| 4,745,608 A | 5/1988 | Aulds et al. |
| 4,793,895 A | 12/1988 | Kaanta et al. |
| 5,036,015 A | 7/1991 | Sandhu et al. |
| 5,081,421 A | 1/1992 | Miller et al. |
| 5,151,584 A | 9/1992 | Ebbing et al. |
| 5,169,491 A | 12/1992 | Doan |
| 5,196,353 A | 3/1993 | Doan |
| 5,222,329 A | 6/1993 | Yu |
| 5,240,552 A | 8/1993 | Yu et al. |
| 5,245,790 A | 9/1993 | Jerbic |
| 5,245,794 A | 9/1993 | Salugsugan |
| 5,258,093 A | 11/1993 | Maniar |

(Continued)

FOREIGN PATENT DOCUMENTS

WO WO 02/078905 A1 * 10/2002

(Continued)

OTHER PUBLICATIONS

Aaron Sussman, *The Amateur Photographer's Handbook*, pp. 6, 286-290, (8th ed. 1973), Thomas Y. Crowell Company, Inc., (1941).

(Continued)

*Primary Examiner*—Aaron W Carter
(74) *Attorney, Agent, or Firm*—Ryan, Mason & Lewis, LLP

(57) ABSTRACT

A method and apparatus is provided for determining thickness of films or layers during chemical-mechanical planarization/polishing (CMP) of a semiconductor substrate or wafer in situ. The method may be used to determine end-point during CMP especially of oxide films deposited on the substrate or wafer. In one embodiment, the method includes: a) capturing images of the surface of the substrate using high speed imaging; b) performing pattern recognition on the captured images; c) selecting one of the captured images based on the pattern recognition; and d) converting the selected image into a thickness measurement. In one form, the high speed imaging comprises a high speed camera, while in another form, the high speed imaging comprises a conventional camera and a laser pulse or flash tube. In yet another embodiment, reflective laser interference patterns of the substrate are captured and analyzed for interference pattern changes that can signal a practical end-point.

28 Claims, 4 Drawing Sheets

U.S. PATENT DOCUMENTS

| | | | |
|---|---|---|---|
| 5,265,378 A | 11/1993 | Rostoker | |
| 5,271,798 A | 12/1993 | Sandhu et al. | |
| 5,272,115 A | 12/1993 | Sato | |
| 5,308,438 A | 5/1994 | Cote et al. | |
| 5,310,455 A | 5/1994 | Pasch et al. | |
| 5,321,304 A | 6/1994 | Rostoker | |
| 5,337,015 A | 8/1994 | Lustig et al. | |
| 5,362,669 A | 11/1994 | Boyd et al. | |
| 5,385,866 A | 1/1995 | Bartush | |
| 5,389,194 A | 2/1995 | Rostoker et al. | |
| 5,399,234 A | 3/1995 | Yu et al. | |
| 5,403,228 A | 4/1995 | Pasch | |
| 5,405,806 A | 4/1995 | Pfiester et al. | |
| 5,439,551 A | 8/1995 | Meikle et al. | |
| 5,449,314 A | 9/1995 | Meikle et al. | |
| 5,483,568 A | 1/1996 | Yano et al. | |
| 5,492,594 A | 2/1996 | Burke et al. | |
| 5,516,400 A | 5/1996 | Pasch et al. | |
| 5,531,861 A | 7/1996 | Yu et al. | |
| 5,559,428 A | 9/1996 | Li et al. | |
| 5,561,541 A | 10/1996 | Sharp et al. | |
| 5,595,526 A | 1/1997 | Yau et al. | |
| 5,597,442 A | 1/1997 | Chen et al. | |
| 5,597,590 A | 1/1997 | Tanimoto et al. | |
| 5,609,511 A | 3/1997 | Moriyama et al. | |
| 5,614,446 A | 3/1997 | Ramaswami et al. | |
| 5,624,304 A | 4/1997 | Pasch et al. | |
| 5,626,715 A | 5/1997 | Rostoker | |
| 5,627,110 A | 5/1997 | Lee et al. | |
| 5,637,185 A | 6/1997 | Murarka et al. | |
| 5,639,388 A | 6/1997 | Kimura et al. | |
| 5,640,242 A * | 6/1997 | O'Boyle et al. | 356/632 |
| 5,643,046 A | 7/1997 | Katakabe et al. | |
| 5,643,050 A | 7/1997 | Chen | |
| 5,644,221 A | 7/1997 | Li et al. | |
| 5,645,682 A | 7/1997 | Skovan | |
| 5,647,952 A | 7/1997 | Chen | |
| 5,656,229 A | 8/1997 | Tanimoto et al. | |
| 5,658,183 A | 8/1997 | Sandhu et al. | |
| 5,660,672 A | 8/1997 | Li et al. | |
| 5,663,101 A | 9/1997 | Cronin | |
| 5,663,797 A | 9/1997 | Sandhu | |
| 5,664,987 A | 9/1997 | Renteln | |
| 5,667,424 A | 9/1997 | Pan | |
| 5,667,433 A | 9/1997 | Mallon | |
| 5,667,629 A | 9/1997 | Pan et al. | |
| 5,668,063 A | 9/1997 | Fry et al. | |
| 5,670,410 A | 9/1997 | Pan | |
| 5,672,091 A | 9/1997 | Takahashi et al. | |
| 5,674,784 A | 10/1997 | Jang et al. | |
| 5,691,253 A | 11/1997 | Kobayashi | |
| 5,695,660 A | 12/1997 | Litvak | |
| 5,700,180 A | 12/1997 | Sandhu et al. | |
| 5,702,292 A | 12/1997 | Brunelli et al. | |
| 5,704,987 A | 1/1998 | Huynh et al. | |
| 5,705,320 A | 1/1998 | Hsu et al. | |
| 5,705,435 A | 1/1998 | Chen | |
| 5,710,076 A | 1/1998 | Dai et al. | |
| 5,712,185 A | 1/1998 | Tsai et al. | |
| 5,716,873 A | 2/1998 | Prall et al. | |
| 5,720,845 A | 2/1998 | Liu | |
| 5,722,875 A | 3/1998 | Iwashita et al. | |
| 5,722,877 A | 3/1998 | Meyer et al. | |
| 5,725,417 A | 3/1998 | Robinson | |
| 5,736,462 A | 4/1998 | Takahashi et al. | |
| 5,738,567 A | 4/1998 | Manzonie et al. | |
| 5,741,171 A | 4/1998 | Sarfaty et al. | |
| 5,747,380 A | 5/1998 | Yu et al. | |
| 5,755,614 A | 5/1998 | Adams et al. | |
| 5,762,536 A | 6/1998 | Pant et al. | |
| 5,762,537 A | 6/1998 | Sandhu et al. | |
| 5,777,739 A | 7/1998 | Sandhu et al. | |
| 5,795,495 A | 8/1998 | Meikle | |
| 5,861,055 A | 1/1999 | Allman et al. | |
| 5,865,666 A | 2/1999 | Nagahara | |
| 5,868,608 A | 2/1999 | Allman et al. | |
| 5,882,244 A | 3/1999 | Hiyama et al. | |
| 5,882,251 A | 3/1999 | Berman et al. | |
| 5,888,120 A | 3/1999 | Doran | |
| 5,893,756 A | 4/1999 | Berman et al. | |
| 5,931,719 A | 8/1999 | Nagahara et al. | |
| 5,948,697 A | 9/1999 | Hata | |
| 5,957,757 A | 9/1999 | Berman | |
| 5,958,148 A * | 9/1999 | Holzapfel et al. | 134/18 |
| 5,985,679 A * | 11/1999 | Berman | 438/7 |
| 6,108,093 A * | 8/2000 | Berman | 356/394 |
| 6,159,073 A * | 12/2000 | Wiswesser et al. | 451/6 |
| 6,186,877 B1 * | 2/2001 | Lofaro | 451/288 |
| 6,204,922 B1 * | 3/2001 | Chalmers | 356/630 |
| 6,229,272 B1 | 5/2001 | Root | |
| 6,247,998 B1 | 6/2001 | Wiswesser et al. | |
| 6,248,995 B1 | 6/2001 | Tanaami et al. | |
| 6,361,646 B1 * | 3/2002 | Bibby et al. | 216/85 |
| 6,374,053 B1 | 4/2002 | Raposa et al. | |
| 7,018,271 B2 * | 3/2006 | Wiswesser et al. | 451/8 |

OTHER PUBLICATIONS

Abidi et al., *Facet Model and Mathematical Morphology for Surface Characterization*, The International Society for Optical Engineering, Proc. of SPIE Conf. on Intelligent Robots and Computer Vision XVIII: Algorithms, Techniques, and Active Vision, vol. 3837, pp. 334-344, Boston, MA Sep. 1999.

Chen et al., *Optimal Scheduling of Capture Times in a Multiple Capture Imaging System*, The International Society for Optical Engineering, Proc SPIE vol. 4669, (2002) © 2002 SPIE, pp. 288-296.

Wolfe et al., *High Speed Imaging Polarimeter*, The International Society for Optical Engineering, Proc. of SPIE vol. 5158, 2003, Bellingham, WA, pp. 24-32.

Wikipedia, the free encyclopedia, *High speed photography*, Internet Article, [Online] 2000, Retrieved from the Internet: http://en.wikipedia.org/wiki/High_speed_photography >[retrieved on Apr. 8, 2008], 7 pages.

* cited by examiner

DETERMINATION OF FILM THICKNESS DURING CHEMICAL MECHANICAL POLISHING

BACKGROUND OF THE INVENTION

1. Field of the Invention

The present invention relates to the manufacture of semiconductor devices and, more particularly, to thickness detection systems used during chemical-mechanical polishing of an integrated circuit substrate.

2. Description of the Prior Art

In certain technologies, such as integrated circuit fabrication, optical device manufacture, and the like, it is generally crucial to the various fabrication processes for the workpiece from which the integrated circuit, optical or other device is to be formed have a substantially planar front surface and, for certain applications, have both a planar front surface and back surface.

One process for providing a planar surface is commonly referred to as mechanical polishing. In mechanical polishing, the surface of the substrate is scoured with a conformable polishing pad. When a chemical slurry is used in conjunction with the polishing pad, the combination of the chemical slurry and the polishing pad generally provides a higher material removal rate than is possible with mere mechanical polishing. This combined chemical and mechanical, commonly referred to as "CMP", is considered an improvement over mere mechanical polishing processes for polishing or planarizing substrates. The CMP technique is common for the manufacture of semiconductor wafers used for the fabrication of integrated circuit die.

CMP typically involves mounting a semiconductor wafer (substrate) face down on a holder and rotating the wafer against a polishing pad mounted on a platen or a belt. The platen is, in turn, rotated or in an orbital state. A slurry containing a chemical that chemically interacts with the facing wafer layer and an abrasive that physically removes that layer is caused to flow between the wafer and the polishing pad or on the pad near the wafer. This technique is commonly applied to planarize metalization layers in the semiconductor wafer, but is applicable to oxide layers or films on the wafer such as silicon dioxide.

Device geometries for semiconductor integrated circuits are becoming increasingly smaller. As a result, the smaller devices tend to cause a variety of problems. One such problem is the contact via alignment between an upper conductive layer and a lower conductive layer. The contact alignment problem between these conductive layers is often caused by a non-uniform inter-dielectric layer therebetween. The non-uniform inter-dielectric layer is often characterized by peaks and valleys defined in the layer surface. This in turn causes other fabrication problems with each succeeding layer. The CMP process is used to reduce these layer non-uniformities.

In the CMP process, it is critical to utilize end-point detection to determine when and how much of the desired film is removed and to terminate the polishing process, thus minimizing the damage to the device performance that overpolishing will cause. The problem with overpolishing is that the film will be thinner than planned and modeled so the device may not act as planned. Semiconductor wafers and flat panel displays are particularly sensitive to overpolishing and damage to the underlying layer. CMP is performed in the processing of semiconductor wafers and/or chips on commercially available polishers, such as the SF776 & 676, AMT Mirra, and LAM Teres polishers. The standard CMP tools have a circular polishing table and a rotating carrier for holding the substrate.

End-point detection has been determined by motor current measuring mechanisms. As well, end-point detection has been accomplished by measuring the film thickness optically by interferometer, ellipsometer, or light beam displacement. If the film is opaque, the difference in reflectivity between the film being etched or polished and the film beneath it can be used to detect the end point of the process (or simply "end-point"). The presence of a reaction product or the absence of a reacting species can be monitored and used to determine when the film etching is complete.

Another method utilized for end-point detection is detecting a change in process pressure. Monitoring process pressure, however, is usually not a very sensitive method of detecting end-points. Typically, current systems actively control process pressure, thus masking any pressure changes at end-point.

During the CMP process of silicon dioxide films on semiconductors, it is desirable to know the thickness of the film as it is being polished. By knowing the thickness of the film, the control and process capability of the tool set is enhanced. There are many systems to perform end-point measuring on flat wafers, or wafers with relatively simple film stacks, such as shallow trench isolation, or potentially the first oxide dielectric over a gate metal. However, there are no end-point systems than can reliably end-point polish in production after two, three, four, five, or more layers of metal (i.e. complex film stacks) have been processed.

Currently, all of the oxide end-point systems currently used in production, are optically based. Of these optically based systems, some use broad band visible light, such as IPEC, Speedfam, and Lam, while other systems use a single wavelength laser system such as AMAT. These systems use some form of either through the pad or off the pad optical sensing that have several features in common which prohibit them from measuring thickness on complex film stacks.

A problem with these systems is trying to determine the appropriate signal by reading an area of the semiconductor from a few square millimeters to a few square centimeters. The signal coming from this area will be quite complex, since it can have up to and over a dozen different oxide thicknesses in the area under evaluation. Currently, there are no CMP systems that are capable of accurately performing end-point on semiconductors with a plurality of different oxide thicknesses.

Another problem with the above optical systems is the rate at which the systems operate. Typically, the semiconductor wafer surface is moving at a radial velocity that translates to up to a few hundred linear feet per minute. Such conventional image capturing (optical) systems will not capture a sharp image with such great velocities.

What is needed is a method of determining thickness of films on a substrate during CMP.

What is also needed is a method of determining when an end-point is reached for substrates having a plurality of layers.

What is further needed is process of end-point detection for semiconductors having a plurality of oxide layers each of which may have a different thickness.

What is even further needed is a process of end-point detection during CMP of silicon dioxide films on semiconductors.

SUMMARY OF THE INVENTION

The present invention is a process and apparatus for measuring layer thickness and/or determining an end-point during chemical mechanical planarization or polishing (CMP) of a substrate having any number of layers.

In one form, the present invention is a method of determining film or layer thickness during CMP of a substrate comprising the steps of: a) capturing an image of an area of the substrate using high speed imaging; b) comparing the captured high speed image to a predetermined pattern; and c) converting the captured high speed image into a film thickness measurement when the captured high speed image corresponds to the predetermined pattern.

In another form, the present invention is an apparatus for determining layer thickness of a substrate during CMP of the substrate including: a) a high speed imager adapted to acquire images of areas of the substrate in situ; b) a processing unit in electronic communication with the high speed imager; and c) memory in electronic communication with the processing unit and containing a plurality of instructions. The plurality of instructions which, when executed by the processing unit, causes the processing unit to: a) compare images acquired by the high speed imager to image patterns stored in the memory device; and b) convert an acquired image into a layer thickness measurement when the acquired image corresponds to a predetermined one of the image patterns stored in the memory device.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Figure 1:
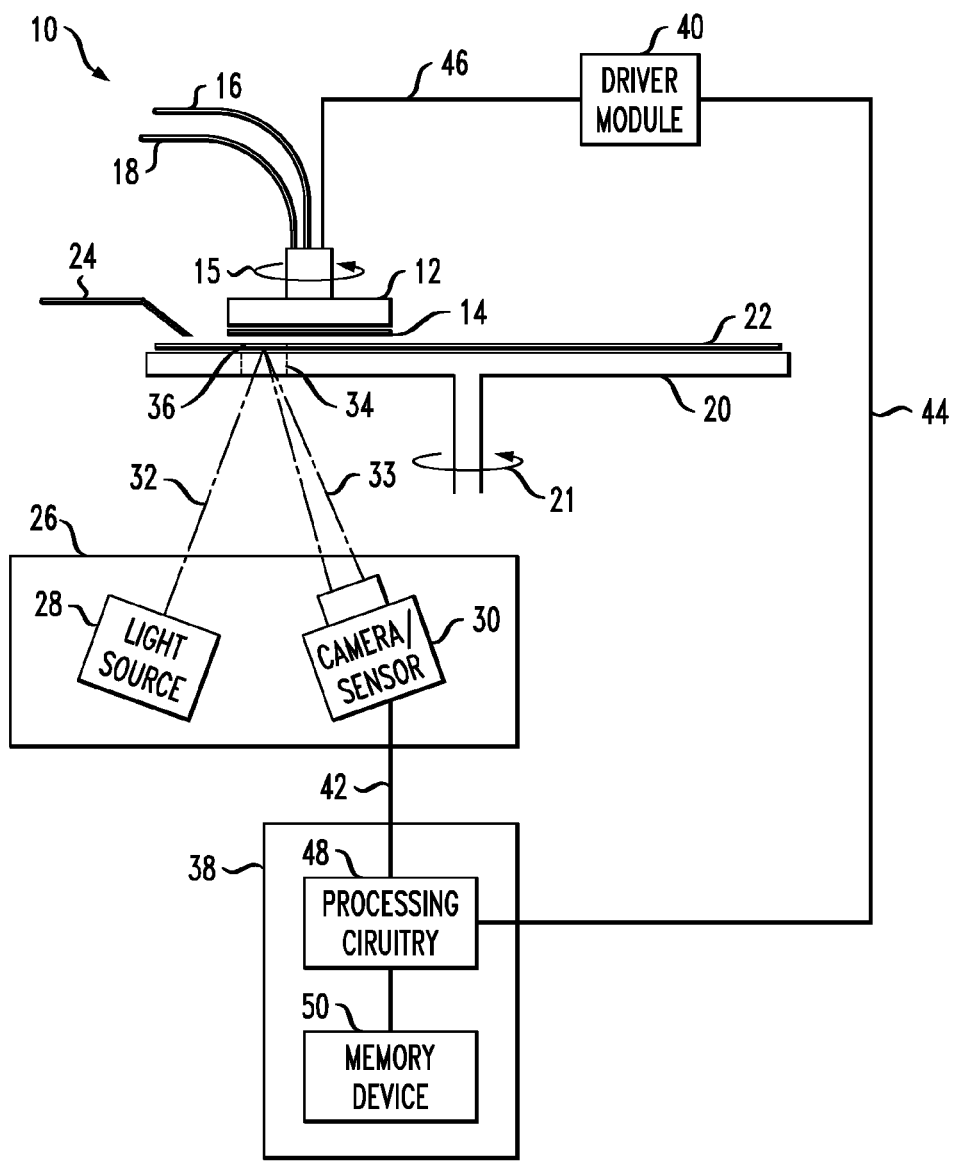
FIG. 1 is a view of a CMP tool in accordance with a preferred embodiment of the present invention.

Corresponding reference characters indicate corresponding parts throughout the several views. The exemplifications set forth herein illustrate several embodiments of the present invention including a preferred embodiment of the invention, in one form, and such exemplifications are not to be construed as limiting the scope of the invention in any manner.

DETAILED DESCRIPTION OF THE INVENTION

With reference now to FIG. 1, there is shown a chemical-mechanical polishing (hereinafter "CMP") tool 10 in accordance with the principles of the present invention. The CMP tool 10 is an electrically active wafer/substrate carrier that is employed to provide adjustment to the thickness of a layer or film of a wafer or layers or films during CMP operations. The CMP tool 10 includes a wafer carrier 12 that is employed to retain a wafer or substrate 14 for CMP operations. The wafer carrier 12 is adapted to be rotated as indicated by the arrow 15, which results in the rotation of the substrate 14. The wafer carrier 12 and thus the substrate 14 is rotating at a high velocity which translates to speeds up to a few hundred linear feet per minute.

In the CMP tool 10 depicted in FIG. 1, the substrate 14 adheres to the wafer carrier 12 by the use of a vacuum applied to the back of the substrate 14. The wafer carrier 12 includes a wafer carrier vacuum line 16 that provides a vacuum for causing the substrate 14 to adhere to the wafer carrier 12 during CMP operations. The CMP tool 10 may be used to process a number of different types of wafers or substrates. Most commonly, the CMP tool 10 is used to process a semiconductor wafer such as a silicon wafer typically having one or more oxide layers or films. The oxide layer(s) or film(s) may consist of silicon dioxide or the like. It should be appreciated, however, that other types of wafers/substrates and layers/films may be used with the CMP 10 and the principles of the present invention disclosed herein.

Figure 4:
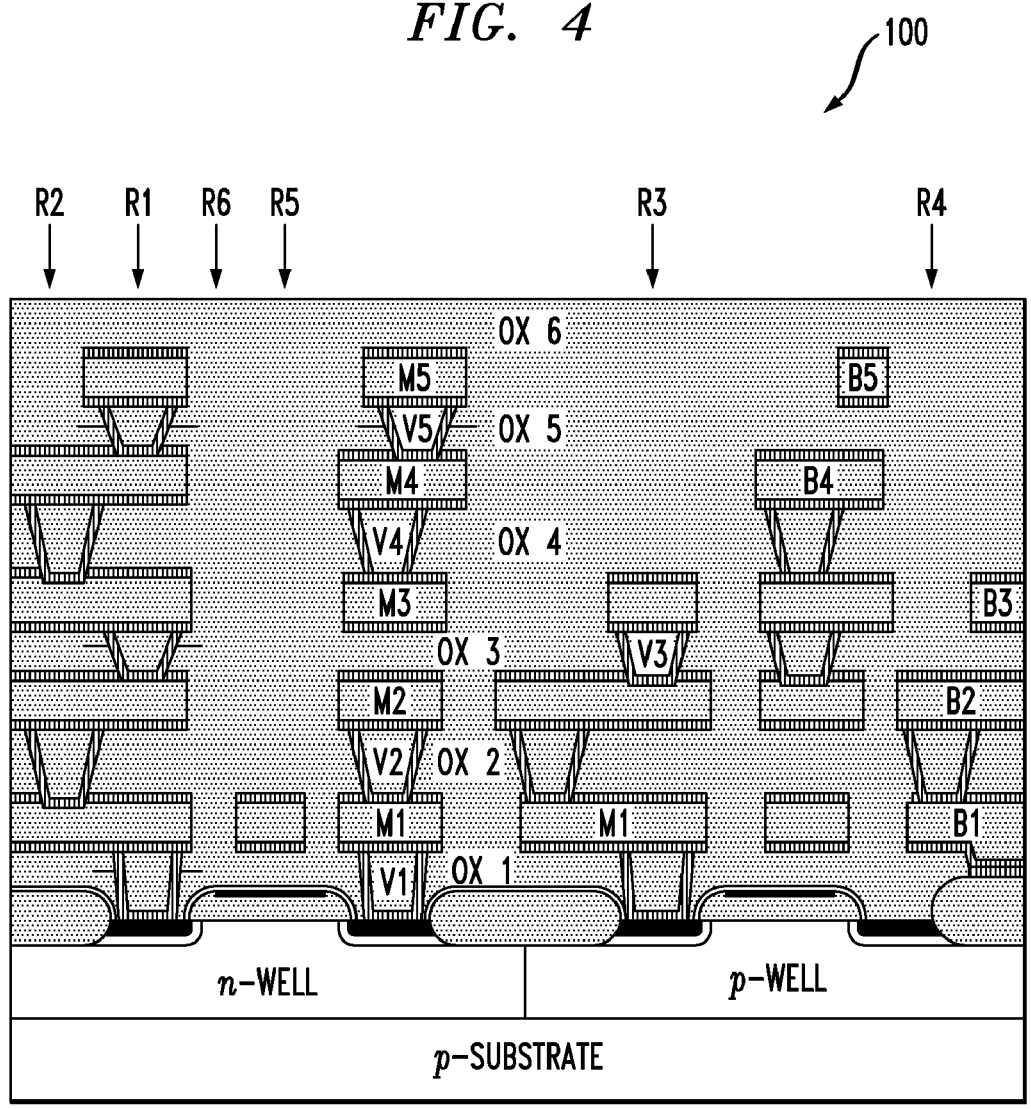
FIG. 4 is a cross-sectional view of a portion of a five layer metal substrate.

Referring to FIG. 4, there is shown a cross-sectional view of a portion of a multiple layer (specifically a five layer) metal (5LM) substrate 100 of the type polished/planarized by the CMP 10. It should be appreciated that the substrate 100 is exemplary of a typical multiple layer substrate (here a ρ-substrate having an η-well and a ρ-well) whose layer thickness or end-point is to be determined by the present invention. As well, it should be appreciated that the portion of substrate 100 shown is only a few microns wide.

The 5LM substrate 100 includes a plurality of horizontal oxide layers labeled OX1, OX2, OX3, OX4, OX5, and OX6. Interspersed over the various oxide layers are a plurality of metal boxes or layers that can be labeled B1, B2, B3, B4, and B5 (as boxes) or M1, M2, M3, M4, and M5 (as layers). The horizontal length and placement of each metal layer or box is dependent upon design. The 5LM substrate 100 also includes a plurality of vias in each of the oxide layers, some of the vias of which are labeled (i.e. V1, V2, V3, V4, and V5). This is a typical exemplary structure for a substrate that will be "read" by the present invention.

Referring to back to FIG. 1, a wafer carrier back pressure air supply line 18 is connected to the wafer carrier 12. The back pressure air supply line 18 supplies a specified pressure of air to counteract the bow induced by the wafer carrier vacuum used to hold the substrate 14 in place on the wafer carrier 12. Both the carrier vacuum and the back pressure may be applied at the same time.

The CMP tool 10 also includes a polishing platen 20 that also rotates during CMP operation as indicated by the arrow 21. The polishing platen 20 retains a polishing pad 22 and rotates this polishing pad 22 during CMP operation. A polish slurry line 24 is provided to apply a polish slurry as is known in the art to the polishing pad 22 during CMP operation. The polish slurry and the polishing pad 22 are used to polish a substrate such as substrate 14.

The CMP tool 10 further includes an in situ image acquisition (imager) unit 26 employed to obtain images of the substrate 14 during CMP operation. Specifically, the in situ image acquisition unit 26 obtains images of the layers or films of oxides and the like on one side of the substrate 14. Alternatively, CMP operation may be periodically halted for obtaining images using the in situ image acquisition unit 26. The in situ image acquisition unit 26 may take several forms each of which can be described with reference to FIG. 1.

It should be appreciated that the position of the image acquisition unit 26, as shown in FIG. 1 is not absolute. The image acquisition unit 26 can be positioned just inside or outside of the polishing pad 22. The substrate 14 or wafer would then be moved over the inside or outside or the polishing pad 22 for a reading (image acquisition) by the image acquisition unit 26.

In one form, the in situ image acquisition unit 26 is a high speed image acquisition system. According to one embodiment of the in situ image acquisition unit 26, there is included a light source 28 and a high speed camera/sensor 30. The high speed camera 30 may be any type of high speed camera such as a high speed digital (e.g. CCD) and/or analog camera such as ones made by EG&G and Kodak. The light source 28 is adapted and/or configured to produce and/or project a light beam 32 towards a window 34 in the polishing platen 20 and a corresponding window 36 in the polishing pad 22. The light beam 32 is reflected (denoted by the reflection beam 33), at least in part, off of the substrate 14, through the windows 36 and 34, and back to the high speed camera 30. In the depicted example, the window 36 in the polishing pad 22 should be filled in with a flexible plastic or other similar material to provide a continuous surface for the polishing slurry to flow over during the polishing operation. The high speed camera 30 is thus able to acquire or capture high resolution images of areas or portions of the substrate 14 by virtue of its high speed nature.

According to another embodiment of the in situ image acquisition unit 26 and still referring to FIG. 1, there is provided a coherent light source 28 (e.g. laser) and a conventional speed camera/sensor 30. The conventional speed camera 30 may be any type of conventional speed camera such as a digital (e.g. CCD) and/or analog camera as are known in the art. The coherent light source 28 is adapted and/or configured to produce and/or project short pulses of a coherent light beam 32 towards a window 34 in the polishing platen 20 and a corresponding window 36 in the polishing pad 22. Each short pulse of the coherent light beam 32 is reflected (denoted by the reflection beam 33), at least in part, off of the substrate 14, through the windows 36 and 34, and back to the conventional speed camera 30. In the depicted example, the window 36 in the polishing pad 22 should be filled in with a flexible plastic or other similar material to provide a continuous surface for the polishing slurry to flow over during the polishing operation. The conventional camera 30 thus acquires or captures high resolution images of the substrate 14 through the use of the high speed (short pulses) of coherent light from the coherent light source 28.

According to yet another embodiment of the in situ image acquisition unit 26 and still referring to FIG. 1, there is provided a short duration light source 28 and a conventional speed camera/sensor 30. The short duration light source 28 is preferably a broad band light source, such as a flash lamp, having a wavelength from 300 nm to 900 nm to provide a very short duration light. The conventional speed camera 30 may be any type of conventional speed camera such as a digital (e.g. CCD) and/or analog camera as are known in the art. The short duration light source 28 is adapted and/or configured to produce and/or project short pulses of a broad band light beam 32 towards a window 34 in the polishing platen 20 and a corresponding window 36 in the polishing pad 22. Each short pulse of the broad bad light beam 32 is reflected (denoted by the reflection beam 33), at least in part, off of the substrate 14, through the windows 36 and 34, and back to the conventional speed camera 30. In the depicted example, the window 36 in the polishing pad 22 should be filled in with a flexible plastic or other similar material to provide a continuous surface for the polishing slurry to flow over during the polishing operation. The conventional camera 30 thus acquires or captures high resolution images of the substrate 14 through the use of the high speed (short pulses) of light from the broad band light source 28.

In the case that the image acquisition unit 26 is on the inside or outside of the polishing pad 22 as indicated above, it may not be necessary to have windows 34 and 36 in order to capture images of the substrate 14. By moving the substrate 14 relative to the polishing pad 22 or vice versa the image acquisition unit 26 may obtain the necessary images without the windows 34 and 36.

In all of the above forms of the in situ image acquisition system 26, the camera 30 is in communication with a processing unit 38 via a communication/data line 42. The processing unit 38 includes a processor and associated processing circuitry 48 of which are known in the art, that is in communication with a memory device 50 as is known in the art. The memory device 50 contains a plurality of substrate image patterns and/or encoded data files of substrate image patterns. Additionally, the memory device 50 contains program instructions that are executable by the processor and associated processing circuitry 48 which allows the processing unit 38 to perform conventional pattern recognition for each of the substrate images acquired by the camera/sensor 30 with or against the substrate images stored in the memory device 50.

The memory device 50 of the processing unit 38 further includes layer thickness measuring program instructions (program) that are executable by the processor and associated processing circuitry 48. The layer thickness measuring program, such as one available from IPEC Precision, is able to convert individual pixels of the image into a thickness measurement. In this manner, the thickness of a particular area or portion of the substrate may be measured once a particular area or portion is ascertained.

The processing unit 38 is in communication with a wafer carrier driver module 40 via a communication/data line 44, while the driver module 40 is in turn in communication with the wafer carrier 12 via a communication/data line 46. The driver module 40 receives signals from the processing unit 38 which it uses to control the location and/or movement of the wafer carrier 12. The processing unit 38 generates appropriate signals that are transmitted to the driver module 40 as the processing unit 38 determines whether an image acquired by the camera 30 matches a stored pattern.

In FIG. 4, the various arrows labeled R1, R2, R3, R4, R5, and R6 represent readings of the substrate taken by the present invention, with the number associated with the letter corresponding to the number of oxide layers that the present invention will read in the vertical direction. The number of oxide layers read depends on whether there is a metal layer in the oxide. Once a metal layer or box is encountered (i.e. detected by the present invention) the number of oxide layers is determined. Locating the proper box by the present invention allows a reading to be made.

It should be appreciated that the in situ image acquisition unit 26 may be placed anywhere as long as the camera and/or light beam and sensor can obtain or capture images of the substrate 14. Thus, the windows 34 and 36 in the polishing platen 20 and the polishing pad 22 respectively, may or may not be necessary depending on the location of the in situ image acquisition unit 26.

Figure 2:
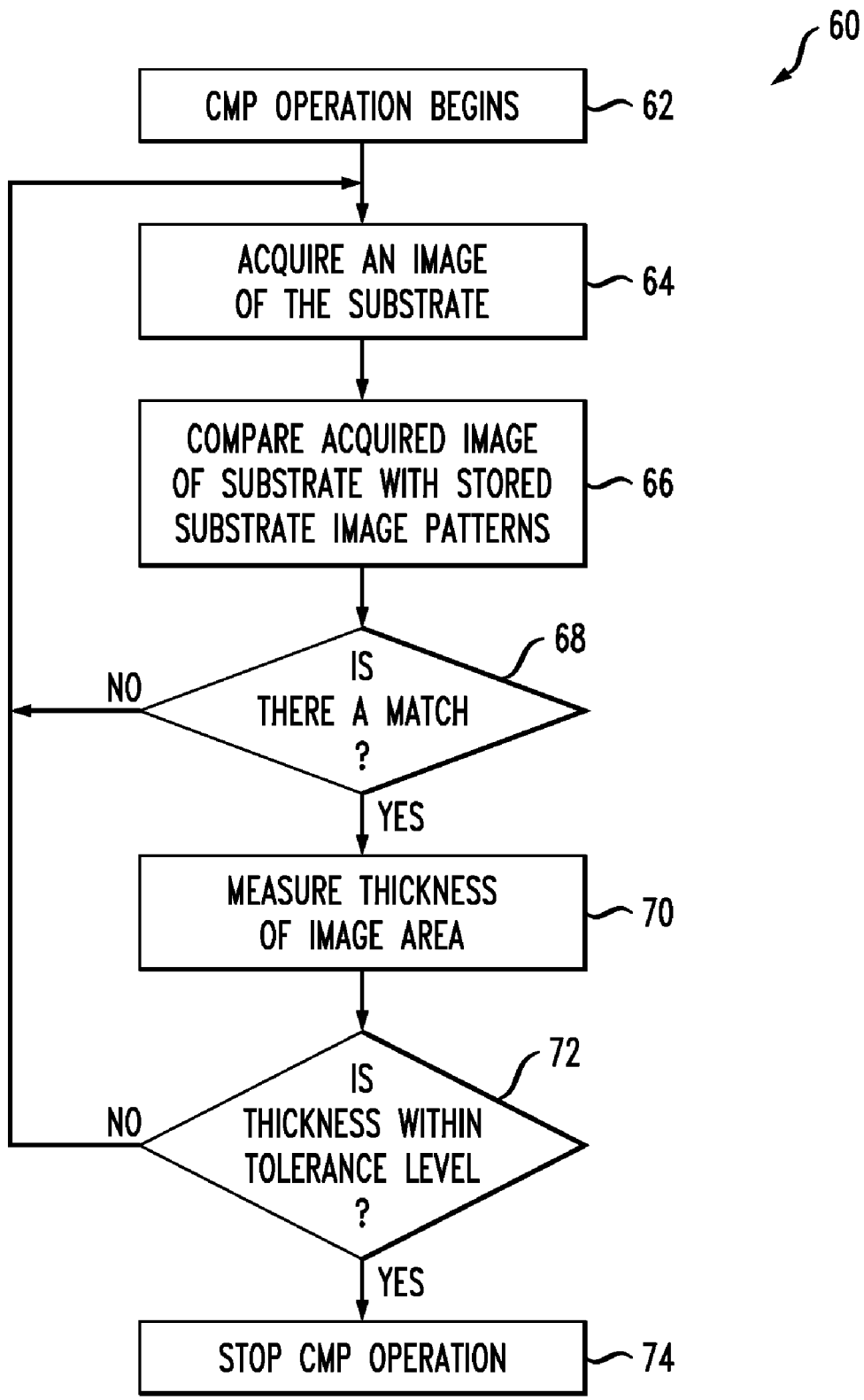
FIG. 2 is a flow chart of a method for determining film thickness in accordance with an embodiment of the present invention.

With additional reference to FIG. 2, the operation of the embodiments of the present invention described above will be discussed. In FIG. 2, there is depicted a flow chart generally designated 60 of a method for determining layer or film thickness of an area or portion of the substrate 14, and/or an end-point of the CMP process. In block 62, CMP operation is commenced. As the CMP operation progresses, the camera 30 acquires or obtains an image of a portion or area of the substrate 14, block 64. The acquired image is transmitted to the processing unit 38 where it is compared with substrate image patterns (i.e. pattern recognition) stored in the memory device 50, block 66. In block 68 a decision is made as to whether the acquired image matches a particular stored image pattern. If the acquired image does not match the particular stored image pattern, then more images are acquired, block 64.

If the acquired image does match the particular stored image pattern, the acquired image is analyzed to determine the thickness of the layer(s), block 70. If the thickness is determined to be greater than that necessary for ending the CMP process, the CMP process continues and additional images are acquired, i.e. a return to block 64. If, however, the thickness is determined to be within a tolerance level for the particular area of the substrate 14, then CMP operation is stopped, block 74.

It should be appreciated that the particular stored image pattern is selectable by the user depending on what area of the substrate 14 is to be measured. This may be accomplished via an interface (not shown) with the processing unit 38. As well, the desired thickness tolerances or exact measurements are selectable by the user. In this manner, any area or portion of the substrate 14 may be measured and CMP operation continued or stopped depending on the measurement.

Each time the proper box (metal layer length) is located and a reading is taken, preferably an estimate is calculated by the processing unit 38 as to when endpoint will occur to close in on the right time. If a reading is taken every five to ten seconds, the CMP 10 can be stopped at the correct time based on the previous reading of the wafer. If the exact reading is acquired or one under the correct value, overpolishing can be minimized.

With reference again to FIG. 1, another embodiment of the present invention will now be described. In this embodiment, the light source 28 is a coherent light source (i.e. a laser) that projects a coherent light beam 32 onto the substrate 14. The coherent light beam reflection 33 falls onto a sensor 30 of the image acquisition unit 26. The reflected coherent light beam 33 represents an interference pattern for the wavelength of the laser light and the thickness of the film(s) of the substrate 14. The images acquired by the sensor 30 are forwarded to the processing unit 38 which contains data relative to reflection patterns for the laser light and the thickness of the film(s). Thus, reflective changes in the reflected coherent light beam 33 indicate changes in film thickness.

Figure 3:
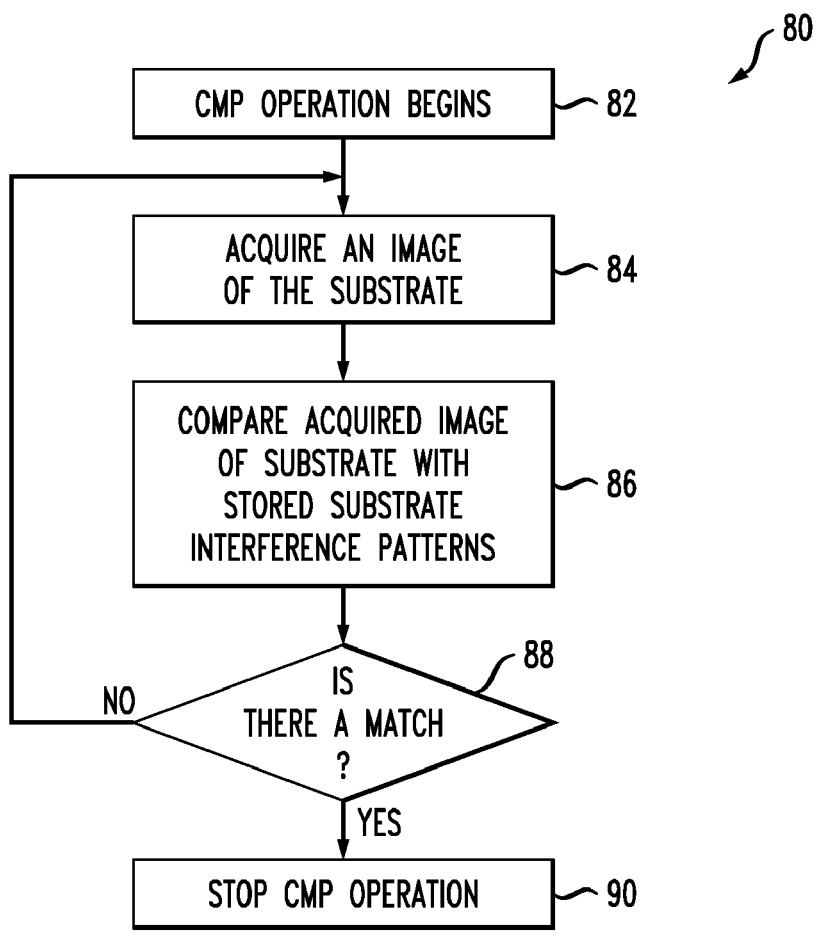
FIG. 3 is a flow chart of another method for determining film thickness in accordance with another embodiment of the present invention.

With additional reference to FIG. 3, the operation of the immediately preceding embodiment of the present invention will be discussed. In FIG. 3, there is depicted a flow chart generally designated 80 of a method for determining layer or film thickness of an area or portion of the substrate 14, and/or an end-point of the CMP process. In block 82 CMP operation begins. As the CMP operation progresses, the sensor 30 acquires or obtains reflection images of a portion or area of the substrate 14, block 84. The acquired image is transmitted to the processing unit 38 where it is compared with substrate reflection image patterns stored in the memory device 50, block 86. In block 88 a decision is made as to whether the acquired reflection image matches a particular stored reflection image pattern. If the acquired image does not match the particular stored image pattern, then more reflection images are acquired, block 84.

It should be appreciated that instead of reflection patterns stored in the memory device 50, program instructions regarding data calculations of reflection patterns may be stored and subsequently used to determine film thickness depending on the reflection patterns acquired by the sensor 30.

Continuing with the program flow chart 80, if the acquired reflection image does match the particular stored image pattern, the thickness of the film(s) of the reflection area of the acquired image is determined, then CMP operation is stopped, block 90.

Each time the proper box (metal layer length) is located and a reading is taken, preferably an estimate is calculated by the processing unit 38 as to when endpoint will occur to close in on the right time. If a reading is taken every five to ten seconds, the CMP 10 can be stopped at the correct time based on the previous reading of the wafer. If the exact reading is acquired or one under the correct value, overpolishing can be minimized.

It should also be appreciated that the methods described above with reference to FIGS. 2 and 3 may be modified to the extent that images/reflections are obtained and compared to stored patterns, images, reflections, or the like, or calculated as necessary.

While this invention has been described as having a preferred design and/or configuration, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A method of determining layer thickness of a particular area of a substrate during CMP of the substrate, the method comprising:
   acquiring an image of a particular area of the substrate while the substrate is moving at a speed of at least 200 lineal feet per minute;
   comparing the acquired image to each one of a plurality of stored image patterns; and
   converting the acquired image into a layer thickness measurement when the acquired image corresponds to one of said plurality of stored image patterns.

2. The method of claim 1, wherein acquiring an image of a particular area of the substrate includes:
   projecting a conventional light source onto the substrate; and
   utilizing a camera operative to acquire images of the particular area of the substrate while the substrate is moving at the speed of at least 200 lineal feet per minute.

3. The method of claim 1, wherein acquiring an image of a particular area of the substrate includes:
   delivering a pulse of light from a coherent light source onto the particular area of the substrate; and
   utilizing a conventional camera.

4. The method of claim 3, wherein said coherent light source comprises a laser.

5. The method of claim 1, wherein acquiring an image of a particular area of the substrate includes:
   delivering a pulse of light from a broad band light source onto the particular area of the substrate; and
   utilizing a conventional camera.

6. The method of claim 5, wherein said broad band light source comprises a flash lamp.

7. The method of claim 1, wherein converting the acquired image into a layer thickness measurement includes converting pixels of the acquired image into layer thickness.

8. The method of claim 1, wherein said determination of layer thickness of the substrate is performed in situ.

9. An apparatus for determining layer thickness of a particular area of a substrate during CMP of the substrate comprising:
- an imager adapted to acquire an image of a particular area of the substrate while the substrate is rotating in situ at a speed of at least 200 lineal feet per minute;
- a processing unit in electronic communication with said imager;
- a memory device in electronic communication with said processing unit and containing a plurality of instructions which, when executed by said processing unit, causes said processing unit to:
  - compare the image acquired by said imager to each one of a plurality of image patterns stored in said memory device; and
  - convert the acquired image into a layer thickness measurement when said
- acquired image corresponds to one of said plurality of image patterns stored in said memory device.

10. The apparatus of claim 9, wherein said imager comprises:
- a pulsed, coherent light source; and
- a conventional camera.

11. The apparatus of claim 10, wherein said coherent light source comprises a laser.

12. The apparatus of claim 9, wherein said imager comprises:
- a conventional light source; and
- a camera operative to acquire images of the particular area of the substrate while the substrate is moving at the speed of at least 200 lineal feet per minute.

13. The apparatus of claim 9, wherein said imager comprises:
- a pulsed, broad band light source; and
- a conventional camera.

14. The apparatus of claim 13, wherein said broad band light source comprises a flash lamp.

15. A method of determining end-point during CMP of a substrate comprising:
- rotating the substrate;
- acquiring an image of an area of the rotating substrate while the substrate is moving at a speed of at least 200 lineal feet per minute using an imager;
- comparing the acquired image to stored image patterns;
- converting the acquired image into a layer thickness measurement when the acquired image corresponds to one of the compared stored image patterns; and
- stopping CMP based upon the layer thickness measurement.

16. The method of claim 15, wherein acquiring an image of an area of the rotating substrate includes:
- projecting a conventional light source onto the area of the substrate; and
- utilizing a camera operative to acquire images of a particular area of the substrate while the substrate is moving at the speed of at least 200 lineal feet per minute.

17. The method of claim 15, wherein acquiring an image of an area of the rotating substrate includes:
- delivering a pulse of light from a coherent light source onto the area of the substrate; and
- utilizing a conventional camera.

18. The method of claim 17, wherein said coherent light source comprises a laser.

19. The method of claim 15, wherein acquiring an image of an area of the rotating substrate includes:
- delivering a pulse of light from a broad band light source onto the area of the substrate; and
- utilizing a conventional camera.

20. The method of claim 19, wherein said broad band light source comprises a flash lamp.

21. The method of claim 15, wherein converting the acquired image into a layer thickness measurement when the acquired image corresponds to one of the compared stored image patterns includes converting pixels of the acquired image into a layer thickness measurement.

22. The method of claim 15, wherein said acquiring an image of an area of the rotating substrate is performed in situ.

23. An apparatus for determining end-point of an area of a substrate during CMP of the substrate comprising:
- an imager configured to acquire images of the substrate while the substrate is rotating in situ at a speed of at least 200 lineal feet per minute;
- a processing unit in electronic communication with said imager;
- a memory device in electronic communication with said processing unit and containing a plurality of instructions which, when executed by said processing unit, causes said processing unit to:
  - compare images of the substrate acquired by said imager to image patterns stored in said memory device;
  - convert an acquired image into a layer thickness measurement when said acquired image corresponds to a selected image pattern stored in said memory device; and
  - stop CMP based upon the layer thickness measurement.

24. The apparatus of claim 23, wherein said imager comprises:
- a pulsed, coherent light source; and
- a conventional camera.

25. The apparatus of claim 24, wherein said coherent light source comprises a laser.

26. The apparatus of claim 23, wherein said imager comprises:
- a conventional light source; and
- a camera operative to acquire images of at least a particular area of the substrate while the substrate is rotating in situ at the speed of at least 200 lineal feet per minute.

27. The apparatus of claim 23, wherein said imager comprises:
- a pulsed, broad band light source; and
- a conventional camera.

28. The apparatus of claim 27, wherein said broad band light source comprises a flash lamp.

* * * * *